US008072139B2

(12) United States Patent
Hatsuda et al.

(10) Patent No.: US 8,072,139 B2
(45) Date of Patent: Dec. 6, 2011

(54) LIGHT EMITTING ELEMENT MODULE AND METHOD FOR SEALING LIGHT EMITTING ELEMENT

(75) Inventors: Kouki Hatsuda, Tochigi (JP); Hiroshi Samukawa, Tochigi (JP)

(73) Assignees: Sony Corporation, Tokyo (JP); Sony Chemical & Information Device, Tokyo (JP)

(*) Notice: Subject to any disclaimer, the term of this patent is extended or adjusted under 35 U.S.C. 154(b) by 987 days.

(21) Appl. No.: 11/996,724

(22) PCT Filed: Mar. 9, 2006

(86) PCT No.: PCT/JP2006/304589

§ 371 (c)(1), (2), (4) Date: Jan. 24, 2008

(87) PCT Pub. No.: WO2007/013200

PCT Pub. Date: Feb. 1, 2007

(65) Prior Publication Data

US 2010/0140654 A1 Jun. 10, 2010

(30) Foreign Application Priority Data

Jul. 25, 2005 (JP) ................................ 2005-214842

(51) Int. Cl.
*H05B 33/00* (2006.01)
*H05B 33/04* (2006.01)
*H05B 33/10* (2006.01)

(52) U.S. Cl. ............. 313/512; 313/506; 445/25; 445/43

(58) Field of Classification Search .......... 313/498–512; 445/25, 43; 427/96.2, 213.3; 438/15, 25, 438/51, 55, 106; 257/272.17, 433, 787–793, 257/100; 528/90, 99
See application file for complete search history.

(56) References Cited

U.S. PATENT DOCUMENTS 4,741,629 A * 5/1988 Hooykaas .................... 384/121
(Continued)

FOREIGN PATENT DOCUMENTS

| | | |
|---|---|---|
| JP | 2003-318448 | 11/2003 |
| JP | 2005-026302 | 1/2005 |
| JP | 2005-116817 | 4/2005 |

OTHER PUBLICATIONS

Machine Translation of Abe et al JP 2005-116817 A.*

*Primary Examiner* — Nimeshkumar Patel
*Assistant Examiner* — Jose M Diaz
(74) *Attorney, Agent, or Firm* — K&L Gates LLP

(57) ABSTRACT

Disclosed is a method for sealing a light-emitting device wherein formation of air bubbles in a light-emitting device module can be prevented by performing no gelation after fitting of a cover member. This method also enables to seal a light-emitting device by using a gel sealing material composed of a gel precursor which uses a solvent. Also disclosed is a light-emitting module formed by such a sealing method. In this method for sealing a light-emitting device, gelation of the gel precursor of a gel sealing material is performed before placing the precursor on the light-emitting device, and thus no gelation is necessary after fitting of a cover member. Consequently, a gel precursor having high viscosity that is difficult to be used in an injection method can be used in this method. Furthermore, a substance which requires use of a solvent can be used as a gel precursor of a gel sealing material. A light-emitting device module with high luminance wherein no air bubbles are included can be obtained by this method.

9 Claims, 5 Drawing Sheets

94
98
92
90
91

U.S. PATENT DOCUMENTS 5,004,357 A * 4/1991 Hooykaas ..................... 384/121
5,097,317 A * 3/1992 Fujimoto et al. .............. 257/786
5,399,805 A * 3/1995 Tyler et al. .................... 174/529
6,030,684 A * 2/2000 Polak et al. ..................... 428/76
6,586,105 B2 * 7/2003 Eguchi et al. ................. 428/447
6,597,063 B1 * 7/2003 Shimizu et al. ............... 257/687
6,605,779 B2 * 8/2003 Takata et al. .................. 174/559
2004/0113549 A1 * 6/2004 Roberts et al. ................ 313/512
2006/0057768 A1 * 3/2006 Nakanishi et al. ............ 438/106

* cited by examiner

[FIG. 1]
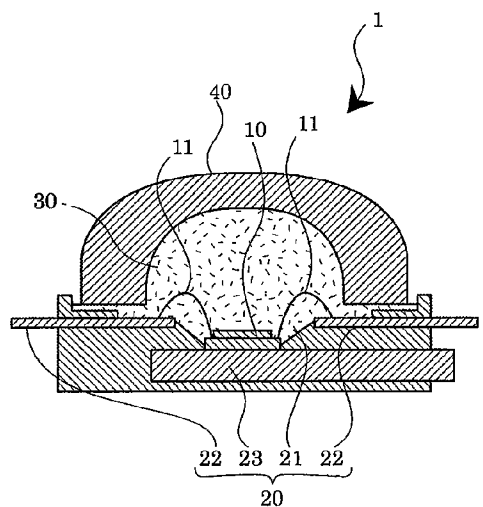
[FIG. 2]
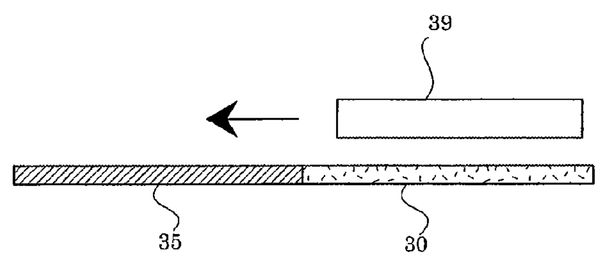

[FIG. 3]
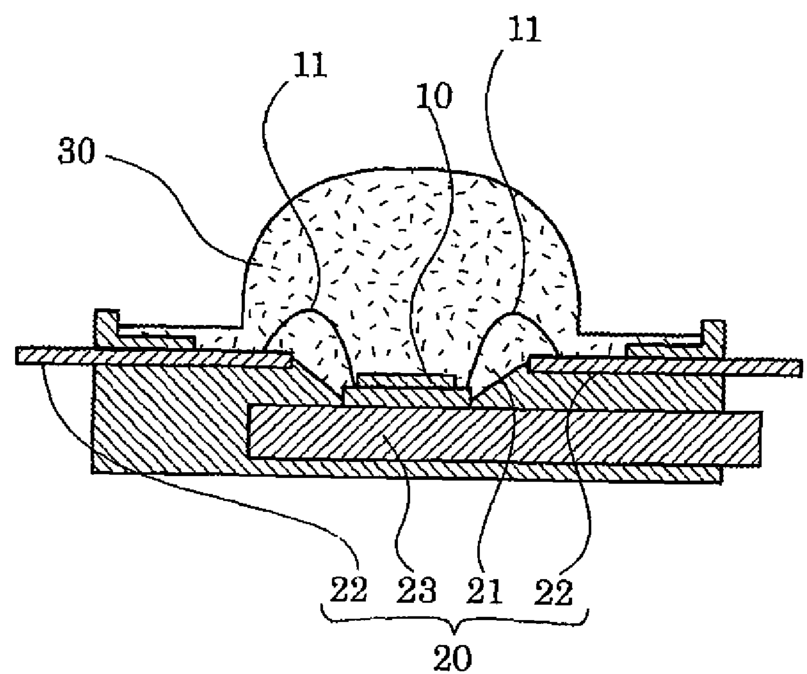

[FIG. 4]
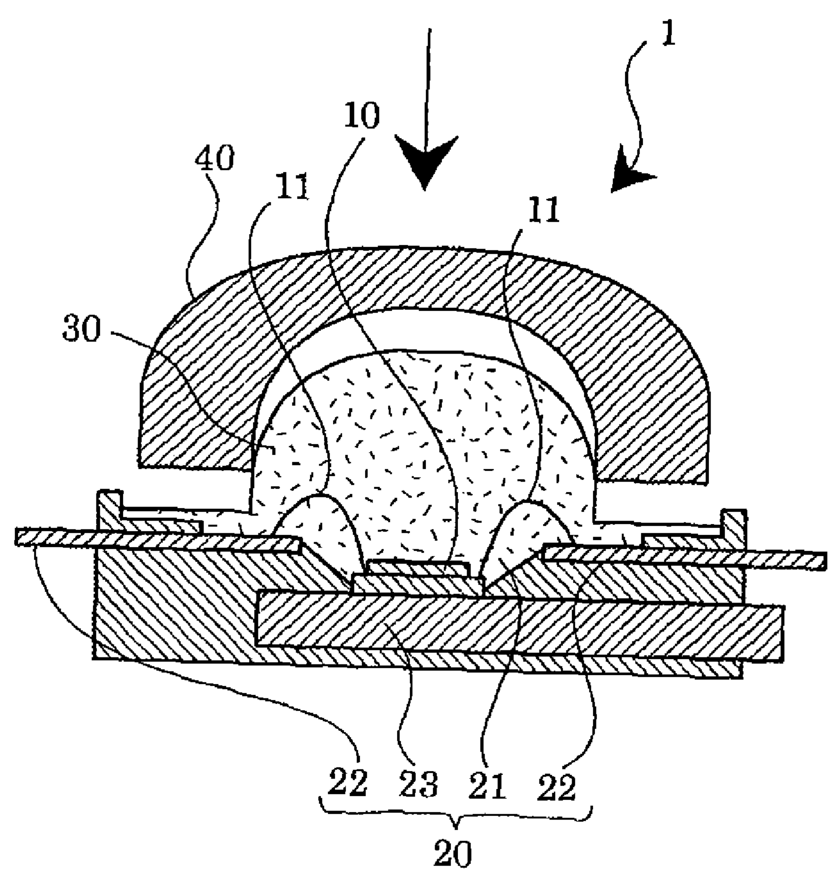

[FIG. 5]
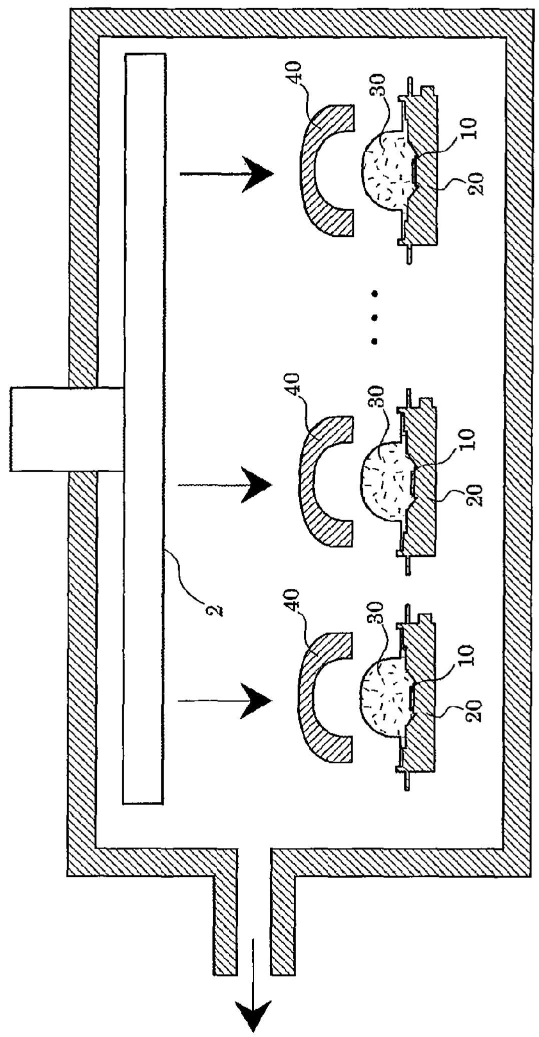
[FIG. 6]
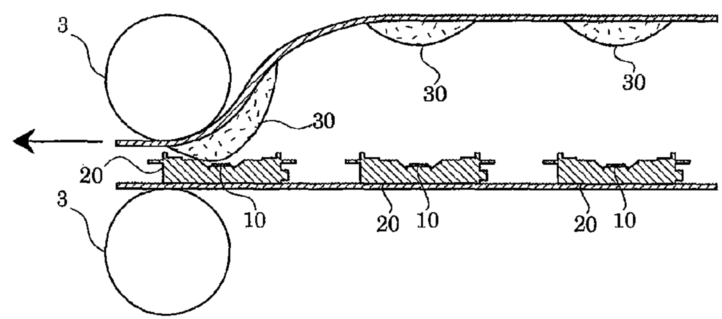

[FIG. 7]
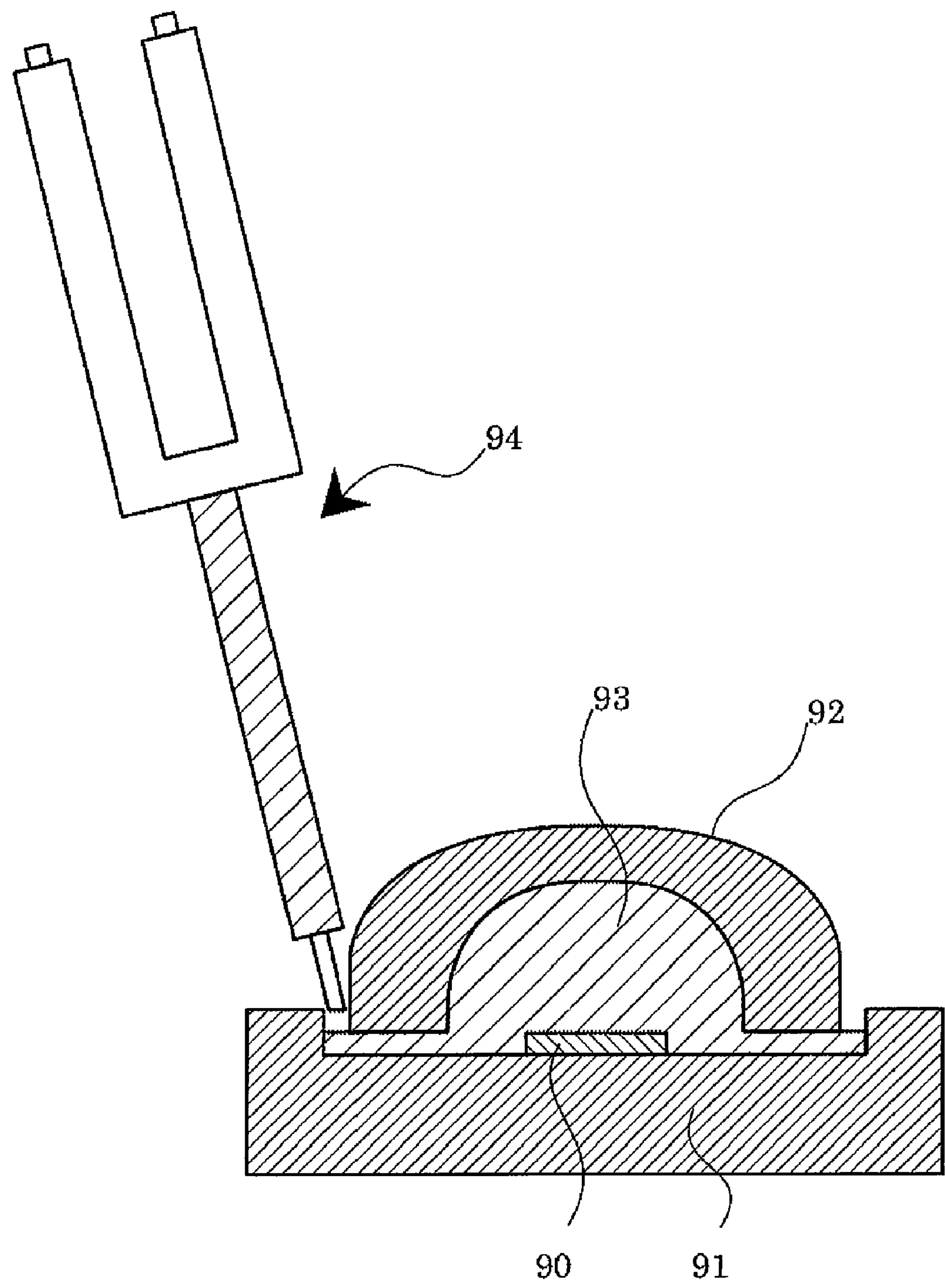

LIGHT EMITTING ELEMENT MODULE AND METHOD FOR SEALING LIGHT EMITTING ELEMENT

CROSS REFERENCE TO RELATED APPLICATIONS

The present application is a national stage of International Application No. PCT/JP2006/304589 filed on Mar. 9, 2006 and claims priority to Japanese Patent Application No. 2005-214842 filed on Jul. 25, 2005, the disclosures of which are incorporated herein by reference.

BACKGROUND

The present invention relates to a method for sealing a light emitting element using a gel sealant made by causing a gel precursor to gel to lose liquidity, and further relates to a light emitting element module formed by this method.

The light emitting element module, such as a light emitting diode (LED) or the like, has properties such as having low power consumption, being miniature, being lightweight, and the like, and is used as a light source of a printer head, a light source of a liquid crystal backlight, a light source of various types of meters, and the like.

As an example of such a light emitting element module, as shown in FIG. 7, there is a light emitting element module containing a light emitting element 90, a base 91 having a concave portion in which the light emitting element 90 is stored, a lid 92 covering the light emitting element 90, and a silicone gel 93, for sealing the light emitting element 90, disposed between the base 91 and the lid 92.

The silicone gel 93 for sealing the light emitting element 90 gels by mixing two types of liquids and applying heat thereto. The gelling reaction of the two types of liquids is achieved by applying heat of 80 degrees Celsius to 150 degrees Celsius, thereby forming the silicone gel 93.

One method for sealing the light emitting element involves placing the light emitting element 90 on the base 91, thereafter unifying the lid 92 and the base 91, and, as shown in FIG. 7, mixing and injecting the two types of liquids making up the silicone gel 93 into between the lid 92 and the base 91 using an injector 94, and then heating the liquids. At this time, the mixture of the two types of liquids is injected until overflowing, so that air bubbles causing a decrease in light output or the like are not mixed in.

Furthermore, there is another method for sealing the light emitting element upon storing the light emitting element in the concave portion of the base, injecting the soft material thereon, placing on the soft material the lid protruding in a direction of the light emitting element, and thereafter applying heat thereto to unify the lid, the soft material, and the base (see, e.g., Patent Document 1). The soft material is injected through potting, and thus is fluidic, but the heat applied after the lid is placed causes the soft material to gel.

Patent Document 1: Japanese Unexamined Patent Application Publication No. 2003-318448

Through the method for mixing two types of liquids while injecting the mixture with the injector 94, however, the liquid must be injected until overflowing to prevent air bubbles between the base 91 and the lid 92. In other words, the overflowing liquid is wasted. The method raises another problem that it is difficult to align a tip of the injector 94 with injection entrance for injecting the two types of liquids between the base 91 and the lid 92.

Furthermore, heating is necessary for the two types of liquid that become the silicone gel 93 to gel. In other words, it is necessary to use a material for the base 91, the lid 92, and the like that can withstand the heat required to cause the two types of liquids to gel, thereby limiting the material that can be used. Furthermore, through such a method, a substance using a solvent cannot be used as the gel precursor of the gel because such a solvent causes air bubbles when evaporated, thereby decreasing the light output.

On the other hand, in the method for sealing the light emitting element of Patent Document 1, by placing the lid that protrudes in a direction of the light emitting element, air bubbles can be prevented from arising in the fluidic soft material. Determining a location at a time when the viscous soft material is injected thereby becomes relatively easy. The method of Patent Document 1, however, requires heat to cause the soft material to gel and does not allow the use of a solvent for the gel precursor of the soft material, thus leaving unsolved problems.

SUMMARY

It is an object of the present invention, in consideration of the aforementioned situation, to provide a method for sealing a light emitting element without executing gelling after the lid is affixed, which can seal the light emitting element with a gel sealant made from a gel precursor using a solvent while preventing formation of air bubbles in a light emitting element module, and further, to provide a light emitting element module formed through the aforementioned sealing method.

A method for sealing a light emitting element according to the present invention is a method for sealing a light emitting element with a gel sealant that has lost fluidity by gelling of a gel precursor, and contains the steps of causing the gel precursor to gel to form the gel sealant, placing the formed gel sealant on the light emitting element, placing a lid on the gel sealant to sandwich the gel sealant between the lid and the light emitting element, and pressing the lid toward the light emitting element.

Through the method for sealing the light emitting element of the present invention, the gel precursor of the gel sealant gels and loses fluidity before the lid is placed on the light emitting element, so that gelling is unnecessary after the lid is affixed. Therefore, a highly viscous gel precursor, which would be difficult to be handled in an injection method, can be used. Furthermore, a substance using a solvent can be used as the gel precursor of the gel sealant.

In the method for sealing the light emitting element of the present invention, the gel sealant is pressed against the light emitting element before the lid is placed on the gel sealant to prevent air bubbles from being mixed in between the light emitting element and the gel sealant.

In the method for sealing the light emitting element of the present invention, at the step where the lid is pushed toward the light emitting element, the lid is pressed with a pressing section under reduced pressure. By lowering the ambient pressure around the light emitting element, air bubbles are prevented from being mixed in between the light emitting element and the gel sealant and between the gel sealant and the lid.

In the method for sealing the light emitting element of the present invention, at the step where the gel sealant is pushed against the light emitting element, the gel sealant, having a position aligned with that of the LED element, is pressed continuously from one end thereof to the other end thereof. Therefore, because the gel is pressed in a manner to push out air bubbles from between the gel sealant and the light emitting element, air bubbles are prevented from being mixed in between the light emitting element and the gel sealant.

In the method for sealing the light emitting element of the present invention, at the step where the gel sealant is formed by causing the gel precursor to gel, the gel precursor is formed on a prescribed separating sheet in a film shape or in a shape corresponding to a shape of the lid, after which, the gel precursor is caused to gel to form the gel sealant and the formed gel sealant is removed from the separating sheet. Therefore, the formed gel sealant can be easily handled.

In the method for sealing the light emitting element of the present invention, the gel sealant has a ratio ($\tan \delta = G''/G'$) of a storage elastic modulus ($G'$) and a loss elastic modulus ($G''$), determined according to a viscoelastic measurement, less than or equal to 1. For example, where sine wave torsional strain is applied to the gel precursor and the dynamic stress of the gel precursor is measured with a rotating rheometer while the temperature of the gel precursor is gradually increased, the $\tan \delta$ value of the gel precursor quickly decreases to be less than or equal to 1 at around a gelling temperature. In other words, in a case where the $\tan \delta$ derived by the viscoelastic measurement is less than or equal to 1, it is certain that the gel precursor has gelled to became a non-fluidic gel. Accordingly, by using the gel sealant having a $\tan \delta$ value less than or equal to 1, it is not necessary to execute gelling after the lid is placed, so that the substance using the solvent can be used as the gel precursor.

In the method for sealing the light emitting element of the present invention, the gel sealant is a compound of polyvinylidene-fluoride resin dissolved into a medium. The refractive index of the compound of polyvinylidene-fluoride resin dissolved into the medium is greater than the refractive index of silicone, which is often used as the gel sealant. Therefore, even in a case where a lid having a relatively high refractive index is used, by using such a substance having a high refractive index as the gel sealant, the difference between the refractive index of the gel sealant and the refractive index of the lid is decreased, thereby increasing brightness of the light emitted from the sealed light emitting element.

Furthermore, the light emitting element module of the present invention contains the light emitting element, the gel sealant that has lost fluidity by gelling of the gel precursor, and the lid sandwiching the gel sealant between the lid and the light emitting element. In the light emitting element module of the present invention, the formed gel sealant is placed on the light emitting element, the lid is placed on the gel sealant, and the light emitting element is sealed by pressing the lid toward the light emitting element.

Through the light emitting element module of the present invention, the gel precursor of the gel sealant gels and loses fluidity before the gel sealant is placed on the light emitting element, so that gel sealant need not be subjected to a gelling step such as heating after the light emitting element is sealed. Therefore, a highly viscous gel precursor, which would be difficult to be handled in an injection method, can be used. Furthermore, a substance using a solvent can be used as the gel precursor of the gel sealant. In such a manner, the light emitting element module having a high degree of brightness and in which air bubbles are not mixed in is provided.

In the light emitting element module of the present invention, the gel sealant has a ratio ($\tan \delta = G''/G'$) of a storage elastic modulus ($G'$) and a loss elastic modulus ($G''$), determined according to a viscoelastic measurement, less than or equal to 1. By using the gel sealant with a $\tan \delta$ value less than or equal to 1, it is not necessary to execute gelling after the lid is placed. In other words, the light emitting element module in which air bubbles are not mixed in is provided.

In the light emitting element module of the present invention, the gel sealant is a compound of polyvinylidene-fluoride resin dissolved into a medium. The refractive index of the compound of polyvinylidene-fluoride resin dissolved into the medium is greater than the refractive index of silicone, which is often used as the gel sealant. Therefore, even in a case where a lid having a relatively high refractive index is used, by using such a substance having a high refractive index as the gel sealant, the difference between the refractive index of the gel sealant and the refractive index of the lid is decreased, thereby providing the light emitting element module having a high degree of brightness.

In the method for sealing the light emitting element according to the present invention as described above, the gel precursor of the gel sealant gels and loses fluidity before the gel sealant is placed on the light emitting element, so that the gel sealant need not be caused to gel after the lid is affixed. Therefore, a highly viscous gel precursor, which would be difficult to be handled in an injection method, can be used. Furthermore, a substance using a solvent can be used as the gel precursor of the gel sealant.

Furthermore, through the light emitting element module of the present invention as described above, the gel precursor of the gel sealant gels and loses fluidity before the gel sealant is placed on the light emitting element, so that the gel sealant need not be subjected to a gelling step such as heating after the light emitting element is sealed. Therefore, a highly viscous gel precursor, which would be difficult to be handled in an injection method, can be used. Furthermore, a substance using a solvent can be used as the gel precursor of the gel sealant. In such a manner, the light emitting element module having a high degree of brightness and in which air bubbles are not mixed in is provided.

Additional features and advantages of the present invention are described in, and will be apparent from, the following Detailed Description and the Figures.

BRIEF DESCRIPTION OF THE FIGURES

FIG. 1 is a diagram showing an example of a light emitting element module containing a light emitting element sealed by the method for sealing a light emitting element according to the present invention;

FIG. 2 is a diagram describing a method for forming a gel sealant used in the method for sealing the light emitting element according to the present invention;

FIG. 3 is a diagram describing a step of placing the gel sealant on the light emitting element in the method for sealing the light emitting element according to the present invention;

FIG. 4 is a diagram describing a step of pressing a translucent lens toward the light emitting element in the method for sealing the light emitting element according to the present invention;

FIG. 5 is a diagram describing an example of the step of pressing a translucent lens toward the light emitting element in the method for sealing the light emitting element according to the present invention;

FIG. 6 is a diagram describing another example of the step of pressing a translucent lens toward the light emitting element in the method for sealing the light emitting element according to the present invention; and FIG. 7 is a diagram describing a step of injecting a gel precursor of the gel sealant according to a conventional method for sealing the light emitting element.

DETAILED DESCRIPTION

The following is a description of the light emitting element module and method for sealing a light emitting element according to the present invention using a light emitting diode (LED) as an example of the light emitting element. The present invention is not limited to the following description, and may be arbitrarily altered without deviating from the general scope of the invention.

The sealing method of the present invention includes causing a gel precursor to gel to form a gel sealant, placing the formed gel sealant on the LED element, placing the lid on the gel sealant, and pressing the lid toward the LED element.

FIG. 1 is a diagram showing an LED element module including the LED element sealed according to the sealing method of the present invention. An LED element module 1 contains an LED element 10 serving as the light emitting element, a base 20 storing the LED element 10, a gel sealant 30 for sealing the LED element 10, and a translucent lens 40 serving as the lid placed on the gel sealant 30.

The LED element 10 is a chip-shaped light emitting element stored in a concave portion 21 of the base 20. The LED element 10 contains electrodes, not shown, on a surface thereof. A location of the electrodes is not particularly limited, but, for example, may be a pair of positive and negative electrodes on an upper surface of the LED element 10. In such a case, as shown in FIG. 1, the pair of electrodes are connected to lead wires 22 of the base 20 by wires 11. Accordingly, by connecting the lead wires 22 of the base 20 to a substrate, not shown, the LED element 10 is energized and can emit light. A method of wiring is not particularly limited. The wires 11 are not particularly limited and, for example, may use material having a low electrical resistance such as gold or copper, and an outer surface of the wires 11 may be coated with a resin or the like to increase mechanical strength of the wires 11.

The LED element 10 is formed by laminating n-type and p-type semiconductors to form a p-n junction. Then, by applying voltage to the p-n junction via the n-type electrode and p-type electrode formed on the surface of the LED element 10, light having a prescribed wavelength is emitted from the p-n junction. Semiconductors such as GaP, GaAs, GaAsP, GaAlAs, GaN, SiC, or the like are exemplified as the semiconductors of the LED element 10.

The base 20, as described above, contains a concave portion for storing the LED element 10. In an internal portion of the concave portion, the lead wires 22, which are connected to the pair of electrodes of the LED element 10 via the wires 11, are formed in a protruding manner. Furthermore, a heat sink 23 is disposed in a lower portion of the LED element 10 to externally release heat generated by the light emission of the LED element 10. A shape of the base 20 is different depending on the translucent lens 40, but the shape is not particularly limited as long as the shape is such that the lid 20, together with the translucent lens 40, can sandwich and enclose the gel sealant 30 and the LED element 10. For example, in a case where the translucent lens 40 is a dome shape, a base 20 having a flat board shape may be used.

The gel sealant 30 is translucent and is a sealant for sealing the LED element 10. The gel sealant 30 has an appropriate amount of softness to protect the LED element 10 and the wire 11 from wetness, shock, or the like. Furthermore, the gel sealant 30 makes it difficult to transmit to the translucent lens 40 the heat generated by the emission of light from the LED element 10, so that degradation of the translucent lens 40 by heat can be prevented.

The gel precursor gels and loses fluidity to become the gel sealant 30 before being placed on the LED element 10. The present invention allows the use of a gel precursor including a solvent because formation of the gel sealant 30 from the gel precursor is executed before placement on the LED element 10, whereas conventional method does not allow the use of such a gel precursor including a solvent because the solvent results in air bubbles.

The gel precursor is a composition that forms the gel sealant 30 by gelling, but this composition is not particularly limited. The gel precursor is usually a reactive composition made by mixing one or more of a polymer, an oligomer, or a monomer having polymerizable group with a catalyst, a polymerization initiator, a hardening agent, a polymerization inhibitor, a medium, a particle having high refractive index, or the like. For example, in a case where a silicone resin is used as the gel sealant 30, the silicone resin is obtained by mixing a siloxane compound having a vinyl group with a siloxane compound having an SiH group, adding a catalyst such as platinum or the like thereto, and applying heat thereto. An oligomer or polymer such as a dimethyl siloxane, a methylphenyl siloxane, a diphenyl siloxane, or the like is used as the siloxane compound. Furthermore, such oligomer or polymer may be homopolymer or copolymer. Yet further, the compound may be a compound that exhibits sol-gel transformation through heating, such as a compound made by dissolving into a medium a polymer having a physical cross-linking property. At high temperatures, such a compound becomes a solution and can be treated as the gel precursor, and at low temperatures, can be treated as the gel sealant. For example, the compound can be polyvinylidene-fluoride resin or polyhexafluoropropylene resin dissolved into a medium. The above medium means a liquid into which polyvinylidene-fluoride or polyhexafluoropropylene resin is dissolved, and includes a solvent having a relatively low boiling point such as toluene, methyl ethyl ketone, methyl isobutyl ketone, acetone, cyclohexane, cyclohexanone, or a liquid having a relatively high boiling point such as polyethyleneglycol or silicone oil. The compound made by dissolving the polyvinylidene-fluoride resin or polyhexafluoropropylene resin into the medium has a refractive index greater than that of silicone conventionally used as the gel sealant. Accordingly, even where the translucent lens 40 having a high refractive index is used, a difference between the gel sealant 30 and the translucent lens 40 is decreased by using such a material having a high refractive index as the gel sealant 30, so that brightness of the light emitting element is increased.

The gel sealant 30 may be formed by mixing into the gel precursor a substance altering a refractive index, altering a color of the light emitted from the LED element 10, or the like. For example, by mixing compound powder including sulfur atoms, nanoscale oxidized titanium particles, or the like into the gel precursor, the refractive index of the thusly formed gel sealant 30 can be adjusted. To mix in the compound powder containing the sulfur atoms, it is necessary to dissolve the gel precursor and the compound powder containing the sulfur atoms into the solvent. According to the sealing method of the present invention, the solvent is removed at a time when the gel sealant 30 is formed, that is, before being placement on the LED element 10. Accordingly, the solvent used in the gel precursor of the gel sealant 30 is not a source of air bubbles. Furthermore, viscosity of the gel precursor is increased where the oxidized titanium particles are used, but the increased viscosity is not a problem because the gel precursor is not injected after the lens is affixed, unlike the conventional method, and instead the gel sealant 30 is placed on the LED element 10 after the gel sealant 30 is formed into the prescribed shape.

The gel sealant 30 is not particularly limited as long as it is a translucent and flexible gel sealant. For example, a gel made from conventionally used silicone resin may be used as the gel sealant 30. The silicone resin gels and loses fluidity to become a gel before the gel precursor of the gel sealant 30 made from the silicone resin is placed on the LED element 10. Accordingly, it is not necessary to execute gelling by heat or the like after the translucent lens 40 is placed on the gel sealant 30. Furthermore, even where the substance to alter the refractive index of the gel sealant 30 is mixed into the gel precursor and increases the viscosity of the gel precursor, the increased viscosity does not raise a problem.

Furthermore, a gel made from a compound of polyvinylidene-fluoride resin dissolved in the medium is exemplified as a material other than the silicone resin. Thereby, even in a case where the translucent lens 40 having a relatively high refractive index is used, by using such material having a very high refractive index as the gel sealant 30, the difference between the refractive index of the gel sealant 30 and the refractive index of the translucent lens 40 is decreased, so that the brightness of the formed light emitting element module can be increased. The material of the gel sealant can be arbitrarily selected depending on the relation between the refractive index of the gel sealant 30 and the refractive index of the translucent lens 40, the flexibility of the gel sealant 30, and the like.

It is desirable that the solvent used in the gel precursor evaporates when heated, but the solvent is not particularly limited thereto, and any solvent necessary to form the gel sealant 30 can be used. For example, toluene, methyl ethyl ketone, methyl isobutyl ketone, acetone, cyclohexane, cyclohexanone, or the like can be used. The solvent can be evaporated at a time when the gel sealant 30 is formed, that is, at a time of gelling of the gel precursor. Furthermore, even where the solvent is not completely evaporated at a time when the gel precursor is gelled, the solvent can be evaporated before the gel sealant 30 is placed on the LED element 10.

The gel precursor is made to lose fluidity, for example, by being heated to form the gel sealant 30 that has gelled. At this time, it is desirable that the gel sealant 30 have a ratio ($\tan \delta = G''/G'$) of a storage elastic modulus ($G'$) and a loss elastic modulus ($G''$), determined according to a viscoelastic measurement, less than or equal to 1. The storage elastic modulus ($G'$) and the loss elastic modulus ($G''$) can be determined according to a viscoelastic measurement and the ratio $\tan \delta$ can be calculated by $\tan \delta = G''/G'$. A $\tan \delta$ value greater than 1 represents that the gel precursor still possesses fluidity, and has therefore not yet become the gel sealant 30. Where the material having a $\tan \delta$ value greater than 1 is placed on the LED element, it is necessary to execute reheating or the like to gel the material after the translucent lens 40 is pressed toward the LED element 10. In other words, such a gel precursor using the solvent cannot be used in this case. On the other hand, a $\tan \delta$ value less than or equal to 1 represents that the gel precursor does not possess fluidity, and has therefore become the gel sealant 30 of the present invention. Accordingly, it is not necessary to execute gelling after the translucent lens 40 is pressed toward the LED element 10. Therefore, such a substance using the solvent can be used as the gel precursor.

In addition, it is desirable that the gel sealant 30 has approximately the same refractive index as the translucent lens 40. The gel sealant 30, sealing the LED element, having approximately the same refractive index as the translucent lens 40 reduces the reflection of the light emitted from the LED element 10 at the interface between the gel sealant 30 and the translucent lens 40. In other words, an amount of light put out from the LED element module 1 is increased, thereby increasing the brightness. For example, in a case where the refractive index of the used translucent lens is 1.7, the refractive index of the sealant 30 can be adjusted to be near the refractive index of the translucent lens 40, which is 1.7, by mixing in a material of the gel sealant 30 or a prescribed substance, so that the brightness of the thusly formed LED element module 1 is increased.

The translucent lens 40 serving as the lid has mechanical strength and translucency and is placed on the gel sealant 30 to sandwich the gel sealant 30 together with the LED element 10. The translucent lens 40 directs the light emitted from the LED element 10 in a direction of an upper surface, a direction of a side surface, or the like in relation to the LED element 10, and can thereby output the light in a prescribed direction.

The translucent lens 40, together with the base 20, sandwiches and encloses the LED element 10 and the gel sealant 30, thereby uniting the LED element 10, the base 20, the gel sealant 30, and the translucent lens 40. For example, the translucent lens 40 may be engaged with the base 20 to form the unified body. Furthermore, in a case where the gel sealant 30 is adhesive, the LED element 10, the base 20, the gel sealant 30, and the translucent lens 40 may be united by the gel sealant 30. The LED element 10 can thereby be sealed by the gel sealant 30 to form the LED element module 1. The shape of the translucent lens 40 may be in any shape as long as the light can be put out in a prescribed direction, as described above. For example, a dome shape shown in FIG. 1 or a convex lens shape may be used. The material forming the translucent lens 40 can be, for example, a glass, a transparent resin, or the like having superior weather resistance, such as an epoxy resin, an acrylic resin, a silicone resin, a polycarbonate resin, or a cycloolefin resin.

First, in the method for sealing the light emitting element according to the present invention, gelling of the gel precursor of the gel sealant 30 is executed. Conditions of gelling can be arbitrarily changed according to the formed gel sealant 30 and the gel precursor thereof. For example, in a case where silicone resin is used, the gel precursor is hardened by heat of 150 degrees Celsius, which may vary depending on the gel precursor, thereby forming the gel made up of the silicone resin.

To seal the LED element 10, the thusly formed gel sealant 30 has a prescribed shape corresponding to the shape of the base 20, the shape of the translucent lens 40, and the like. A method for processing the gel sealant 30 into the prescribed shape involves executing gelling after the gel precursor of the gel sealant 30 is formed in the prescribed shape with a dispenser, screen printing, or the like. There also exists a method for forming the gel sealant 30 into the prescribed shape after gelling of the gel precursor, and the method is not particularly limited as long as the gel sealant 30 can be formed in the prescribed shape.

A method for processing the gel sealant 30 into the prescribed shape after gelling involves, as shown in FIG. 2, for example, spreading the gel precursor 35 of the gel sealant 30 into a film and executing gradual heating of the gel precursor 35 film, through a heating section such as a heater 39, to form the gel sealant 30 film by moving the heater 39. The thusly formed gel sealant 30 film is then die-cut or the like in the shape necessary to seal the LED element 10. Therefore, the gel sealant 30 having the same shape as the base 20 or the translucent lens 40 can easily be formed.

During gelling, the gel precursor may be formed in the shape described above on a separating sheet, after which the gel precursor may then be gelled by heating and the formed gel sealant 30 may then be removed from the separating sheet. Therefore, when the formed gel sealant 30 is removed, the gel sealant 30 does not break and a portion thereof does not remain on the sheet. Furthermore, the gel sealant 30 can be removed from the separating sheet after being placed on the LED element 10 with the separating sheet still attached.

Therefore, the gel sealant 30 can be placed on the LED element 10 without being damaged or dirtied. In other words, the gel sealant 30 can be easily handled.

Next, as shown in FIG. 3, the gel sealant 30 formed in the manner described above is placed on the LED element 10, which is stored in the concave portion of the base 20 and connected to the lead wires 22 by the wires 11. At this time the wires 11 may be coated with a resin or the like to prevent disconnection and to increase mechanical strength. Furthermore, the wires 11 may be laid along the concave portion of the base 20.

After the gel sealant 30 is placed on the LED element 10, the translucent lens 40 is placed on the gel sealant 30. As shown in FIG. 4, the translucent lens 40 is then pressed toward the LED element 10 to sandwich the gel sealant 30 between the LED element 10 and the translucent lens 40, thereby sealing the LED element 10 with the gel sealant 30. The base 20, the translucent lens 40, the LED element 10, and the gel sealant 30 are then unified to form the LED element module 1.

The gel sealant 30 sealing the LED element 10 is caused to gel before being placed on the LED element 10. Accordingly, even where the gel precursor using the solvent is used, the LED element 10 can be sealed without mixing in air bubbles caused by the solvent because the solvent is evaporated before the gel sealant 30 is placed on the LED element 10. In other words, substance using solvent can be used as the gel precursor of the gel sealant 30.

A method for pressing the translucent lens 40 toward the LED element 10 is not particularly limited. For example, as shown in FIG. 5, multiple as of yet unformed LED element modules are arranged in a condition where the translucent lens 40 is placed on the gel sealant 30, and an area surrounding the elements is depressurized by a pump or the like. Each translucent lens 40 is then pressed from above each LED element 10 by a pressing section such as a bonder 2 having appropriate softness at a portion thereof contacting the translucent lens 40. By depressurizing the surrounding area during pressing of the translucent lens 40, gas trapped between the translucent lens 40 and the gel sealant 30, between the gel sealant 30 and the LED element 10, and the like can be reduced. In other words, the LED element 10 can be sealed by the gel sealant 30 without mixing in air bubbles that cause degradation of the light output or the like. Furthermore, pressing of the translucent lens 40 by the bonder 2 is not limited to an arrangement of multiple unformed LED element modules, and may be performed on a single unformed LED element module as well. The bonder 2 used here is not particularly limited as long as the bonder 2 is relatively soft, and may be, for example, rubber, gelled resin, or the like.

In the sealing method of the present invention, the gel sealant 30 may be pressed against the LED element 10 before the translucent lens 40 is placed on the gel sealant 30. By this pressing, the air bubbles are pressed outward from between the LED element 10 and the gel sealant 30, so that an amount of mixed in air bubbles is decreased. For example, in the method shown in FIG. 6, the gel sealant 30 may be pressed against the LED element 10.

Such a process involves, as shown in FIG. 6, aligning a position of the gel sealant 30 formed in a shape on the separating sheet through the method described above with a position of the base storing the LED element 10 in a prescribed location detachably affixed to the film or the like at roughly the same interval as the gel sealant 30. Therefore, the position of the gel sealant 30 can be aligned with the position of the LED element 10. The gel sealants 30 and the LED elements 10 having aligned positions are held in place and moved on rollers 3 having a space therebetween to sufficiently press the gel sealant 30 against the LED element 10. In other words, the gel sealants 30 and the LED elements 10 having aligned positions are sandwiched by the rollers 3 such that the gel sealant is continuously pressed from one end to the other end against the LED element 10. By sandwiching the gel sealant 30 and the LED element 10 between the rollers 3, the gel sealant 30 can be pressed against the LED element 10. At the same time as the pressing, the gel sealant 30 can be removed from the separating sheet. Through such a method the air bubbles mixed in between the gel sealant 30 and the LED element 10 can be moved in a direction from one end of the gel sealant 30 to the other end and then pushed out externally. Accordingly, mixing in of the air bubbles between the gel sealant 30 and the LED element 10 can be prevented. In addition to the aforementioned method, other methods, such as moving the rollers to press the gel sealant 30 against the LED element 10, for example, may be used.

After the gel sealant 30 has been pressed against the LED element through the aforementioned method, the translucent lens 40 can be placed on the gel sealant 30 and then pressed toward the LED element 10 to seal the LED element 10, in the manner described above. Because the gel sealant 30 has lost fluidity, it is not necessary to subject the gel sealant 30 to the gelling process such as heating or the like after the LED element 10 is sealed.

The light emitting element module of the present invention can be formed according to the method for sealing the light emitting element as described above. Therefore, the mixing of air bubbles into the light emitting element module can be prevented, so that the light emitting element module does not have decreased light output caused by air bubbles. Furthermore, because the gel precursor including the solvent can be used, the refractive index of the gel sealant can be adjusted to match the refractive index of the translucent lens by arbitrarily changing the material of the gel sealant or the substance mixed into the sealant, so that the light emitting element module having increased brightness can be formed.

EXAMPLES

First Example 5 g of bis (4-methacryloyl-thiophenyl)sulfide (product of Sumitomo Seika Chemicals Co., Ltd.), 5 g of urethane acrylate EB230 (product of Daicel), and 0.1 g of polymeric initiator Perhexyl O (product of NOF corporation) were mixed into a mixed solution in which toluene and methyl ethyl ketone were mixed at a 1:1 ratio. A drop of the mixed solution, having a circular shape with a diameter of 3 mm and a thickness of 0.75 mm after the gel is formed, was then dripped onto the separating sheet using a dispenser. Thereafter, heat of 100 degrees Celsius was applied to the mixed solution to evaporate the solvent and cause the mixed solution to gel, thereby forming the gel sealant to be placed on the LED element. The refractive index of this gel sealant was 1.61.

The LED element was stored in the concave portion of the base, and the electrodes of the LED element were connected to the lead wires of the base by gold wires. The gel sealant formed in the first example was then grasped by tweezers and placed on the LED element 10. The translucent lens was then placed on the gel sealant. The refractive index of the translucent lens was 1.61. Multiple as of yet unformed LED element modules, which were made up of the LED element, the gel sealant placed on the LED element, and the translucent lens placed on the gel sealant, were arranged in a space that can be depressurized. The area in which the as of yet unformed LED element modules were arranged was then depressurized to 0.5 Torr, after which the bonder formed of silicone rubber was used to press the translucent lens from above toward the LED element, thereby sealing the LED element. At this time, the pressure was set to 10000 Pa.

Through the aforementioned method, even where a solution is used in which the gel precursor of the gel sealant is dissolved in the solvent, the LED element can be sealed by the gel sealant without mixing in air bubbles. Furthermore, through the aforementioned method, the LED element module can be formed without air bubbles. Yet further, the refractive index of the translucent lens and the refractive index of the gel sealant can be made substantially the same, thereby increasing the brightness of the formed LED element module.

Second Example

A dispersion liquid, containing 4 g of oxidized titanium nanoparticles having an average particle diameter of 12 nm dispersed in a methyl ethyl ketone, was mixed with 10 g of silicone 3062 A liquid (product of GE Toshiba Silicone Co., Ltd.) used for potting. Next, a mixture formed in the same manner by mixing 10 g of silicone 3062 B liquid (product of GE Toshiba Silicone Co., Ltd.) used for potting into the A liquid having the dispersion liquid mixed therein was stretched to coat the separating sheet to form a film having a thickness of 1.25 mm. Heat of 150 degrees Celsius was applied by a heater to the mixture stretched into a film to evaporate the solvent and harden the mixture, thereby forming the gel film.

The LED element was stored in the concave portion of the base, and the electrodes of the LED element were connected to the lead wires of the base by gold wires. The multiple bases storing the LED elements 10 were then detachably affixed to a base film at prescribed intervals.

Next, the formed gel film was die-cut, without cutting the separating sheet, in accordance with the intervals of the multiple bases, affixed to the base film, storing the LED elements. At this time, the gel film was die-cut to form the gel sealant having the diameter of 4 mm and the thickness of 1.25 mm.

The position of the bases storing the LED elements on the base film was aligned with the position of the gel sealant formed on the separating sheet, and the roller pushed the gel sealant onto the base to laminate the base and gel sealant while the base film and the separating sheet were moved from one end of the gel sealant to the other end thereof. In other words, the gel sealant and the LED element was moved from one end of the gel sealant to the other end thereof while the gel sealant was pressed against the LED element, thereby preventing the mixing in of air bubbles between the gel sealant and the LED element.

After the pressing, the separating sheet was removed, the translucent lens was placed on the gel sealant, and the LED element was sealed by the gel sealant through the method according to the first example. Therefore, even where a solution is used in which the gel precursor of the gel sealant is dissolved in the solvent, the LED element can be sealed by the gel sealant without mixing in air bubbles. Furthermore, through the aforementioned method, the LED element module can be formed without air bubbles.

Third Example

Instead of the dispersion liquid of oxidized titanium nanoparticles dispersed in methyl ethyl ketone and mixed with the liquid A as shown in the second example, only the methyl ethyl ketone, serving as the solvent, was mixed with the liquid A to form the silicone gel, and the LED element was then sealed in the same manner as described in the second example. Therefore, even where a solution is used in which the gel precursor of the gel sealant is dissolved in the solvent, the LED element can be sealed by the gel sealant without mixing in air bubbles. Furthermore, through the aforementioned method, the LED element module can be formed without air bubbles.

Fourth Example

The viscoelastic measurement was executed using a dynamic viscoelastic measurement device (DMS-6100 (product of SII NanoTechnology Inc.)). The gel sealants formed in the first example and the third example were measured in a manner such that the resin compound having a diameter of 12.5 mm was sandwiched between parallel plates, the bottom plate was moved alternately left and right under a strain of 10%, an angular speed was changed within a range of 0.1 rad/s to 400 rad/s, and the storage elastic modulus (G'), the loss elastic modulus (G"), and the tan δ were measured. A result of the measurement was that the gel sealant formed according to the first example has a storage elastic modulus (G') of 0.12 MPa, a loss elastic modulus (G") of 1.5 kPa, and a tan δ of 0.0125, which is less than or equal to 1. The gel sealant formed according to the third example has a storage elastic modulus (G') of 17 kPa, a loss elastic modulus (G") of 750 Pa, and a tan δ of 0.0441, which is less than or equal to 1. Therefore, it is understood the gel sealants formed according to the first example and the third example has no fluidity.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A method for sealing a light emitting element with a gel sealant made by causing a gel precursor to gel to lose fluidity, comprising the steps of:

(a) causing the gel precursor to gel to form the gel sealant, the gel precursor comprises bis (4-methacryloylthiophenyl)sulfide dissolved into a medium;

(b) placing the formed gel sealant on the light emitting element (c) placing a lid on the gel sealant to sandwich the gel sealant between the lid and the light emitting element; and (d) pressing the lid toward the light emitting element.

2. The method for sealing the light emitting element according to claim 1, further comprising the step of pressing the gel sealant toward the light emitting element before step (c).

3. The method for sealing the light emitting element according to claim 1, wherein the lid iso pressed with a pressing section under reduced pressure at step (d).

4. The method for sealing the light emitting element according to claim 2, wherein the gel sealant, having a position aligned with that of the LED element, is pressed continuously from one end thereof to the other end thereof at the step of pressing the gel sealant toward the light emitting element.

5. The method for sealing the light emitting element according to claim 1, wherein, at step (a):

the gel precursor is formed, on a prescribed separating sheet, in a film shape or in a shape corresponding to a shape of the lid, after which;

the gel precursor gels to form the gel sealant; and the formed gel sealant is removed from the separating sheet.

6. The method for sealing the light emitting element according to claim 1, wherein the gel sealant has a ratio (tan $\delta = G''/G'$) of a storage elastic modulus (G') and a loss elastic modulus (G"), determined according to a viscoelastic measurement, less than or equal to one.

7. The method for sealing the light emitting element according to claim 1, wherein the gel sealant is a compound of polyvinylidene-fluoride resin dissolved into a medium.

8. A light emitting element module, comprising:

a light emitting element;

a gel sealant that has lost fluidity by gelling of a gel precursor; and a lid sandwiching the gel sealant between the lid and the light emitting element, wherein:

the formed gel sealant is placed on the light emitting element;

the lid is placed on the gel sealant;

the light emitting element is sealed by pressing the lid toward the light emitting element; and the gel precursor comprises bis (4-methacryloyl-thiophenyl)sulfide dissolved into a medium.

9. The light emitting element module according to claim 8, wherein the gel sealant has a ratio (tan $\delta = G''/G'$) of a storage elastic modulus (G') and a loss elastic modulus (G"), determined according to a viscoelastic measurement, less than or equal to one.

* * * * *